(12) United States Patent
Choi

(10) Patent No.: US 7,091,090 B2
(45) Date of Patent: Aug. 15, 2006

(54) NONVOLATILE MEMORY DEVICE AND METHOD OF FORMING SAME

(75) Inventor: Yong-Suk Choi, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 121 days.

(21) Appl. No.: 10/761,250

(22) Filed: Jan. 22, 2004

(65) Prior Publication Data

US 2004/0185628 A1 Sep. 23, 2004

(30) Foreign Application Priority Data

Jan. 22, 2003 (KR) ............... 10-2003-0004223

(51) Int. Cl.
*H01L 21/336* (2006.01)
(52) U.S. Cl. .................. 438/261; 438/287; 438/596
(58) Field of Classification Search .............. None
See application file for complete search history.

(56) References Cited

U.S. PATENT DOCUMENTS 6,177,318 B1 * 1/2001 Ogura et al. ............... 438/267

FOREIGN PATENT DOCUMENTS

| JP | 2001-156188 | 6/2001 |
|---|---|---|
| KR | 2002-65858 | 8/2002 |

OTHER PUBLICATIONS

Chang, "A New SONOS Memory Using Source-Side Injection for Programming", Jul. 7, 1998, IEEE Electron Device Letters, vol. 19, No. 7, pp. 253-255.*

* cited by examiner

*Primary Examiner*—Chandra Chaudhari
(74) *Attorney, Agent, or Firm*—Harness, Dickey & Pierce, P.L.C.

(57) ABSTRACT

In a method of forming a silicon-oxide-nitride-oxide-silicon (SONOS) type nonvolatile memory device, a plurality of first gates may be formed on a semiconductor substrate. A plurality of charge storage spacers may be formed on the plurality of first gates so that a given charge storage spacer may be disposed on a sidewall of a given first gate. A plurality of second gates may be disposed on the plurality of first gates so that a given second gate is on a sidewall of a given first gate and covers a given charge storage spacer.

14 Claims, 17 Drawing Sheets

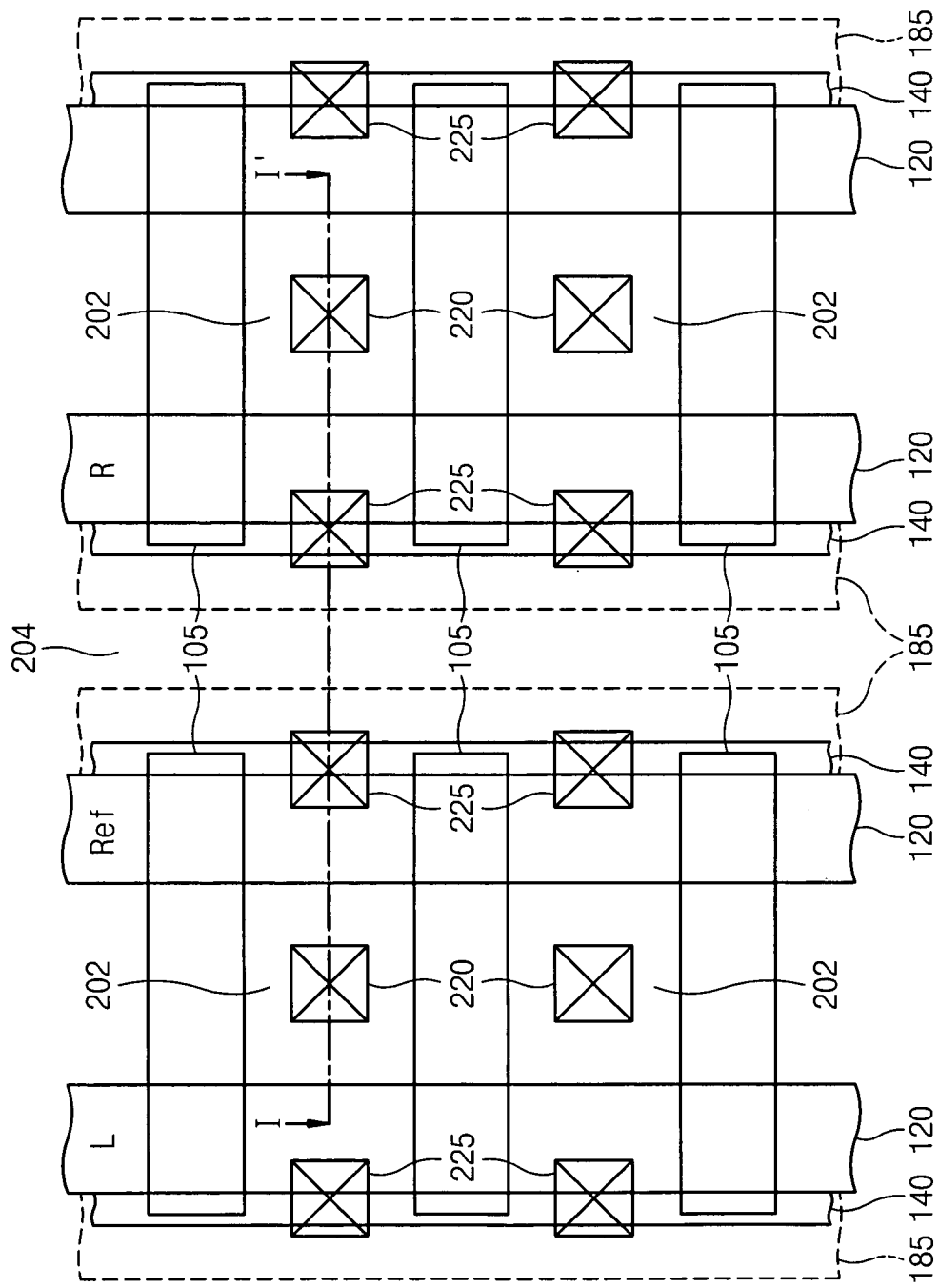

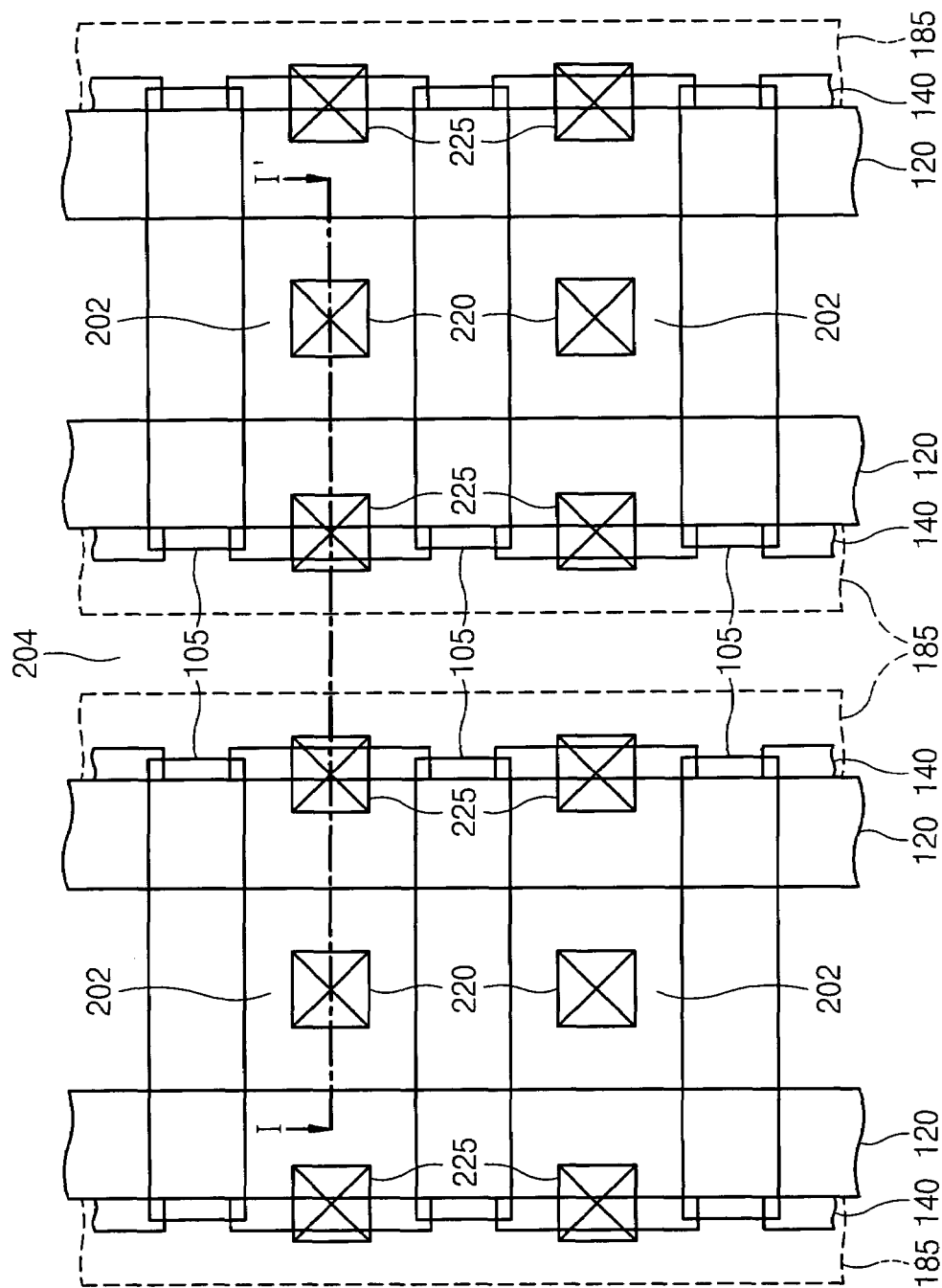

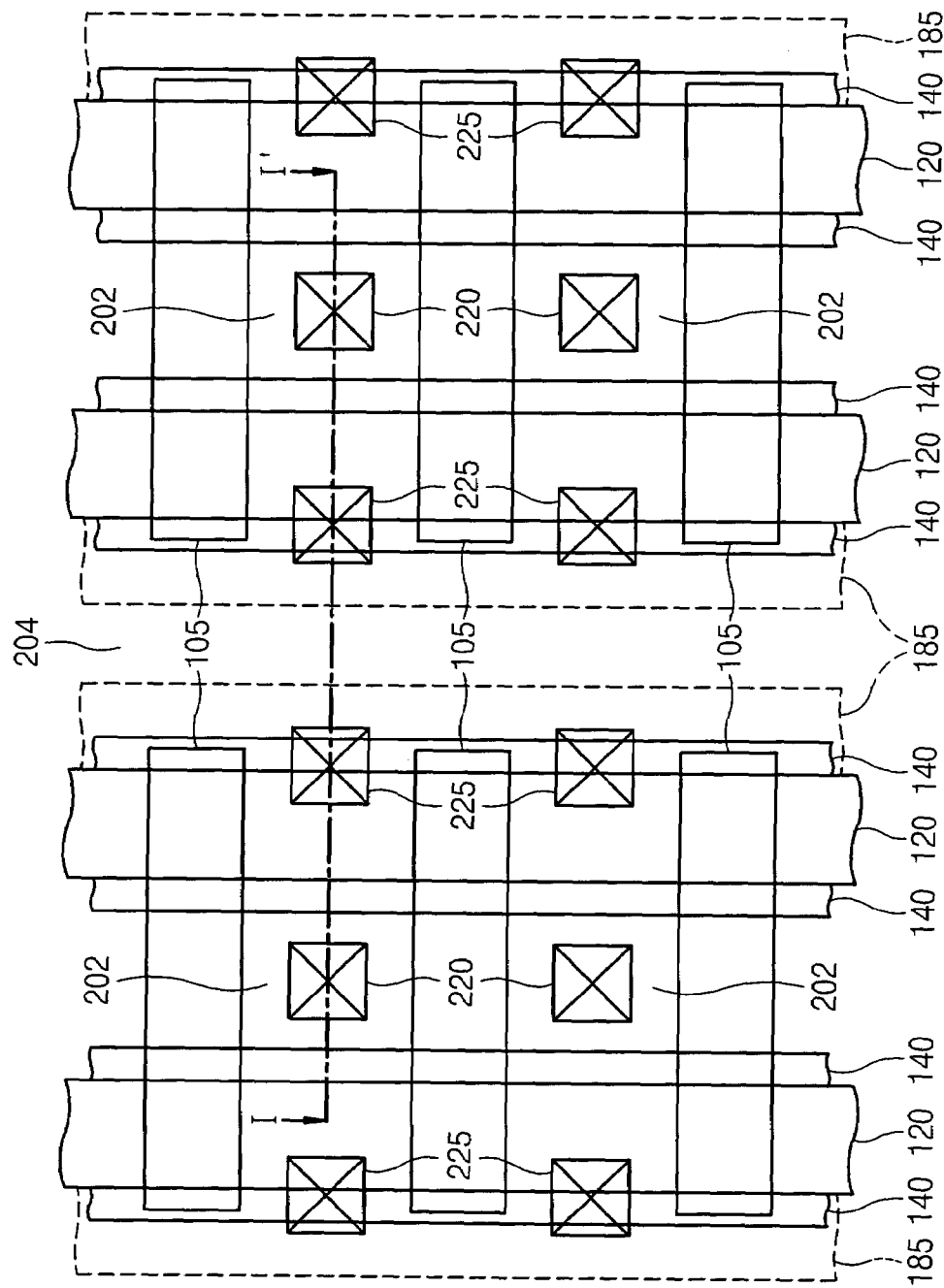

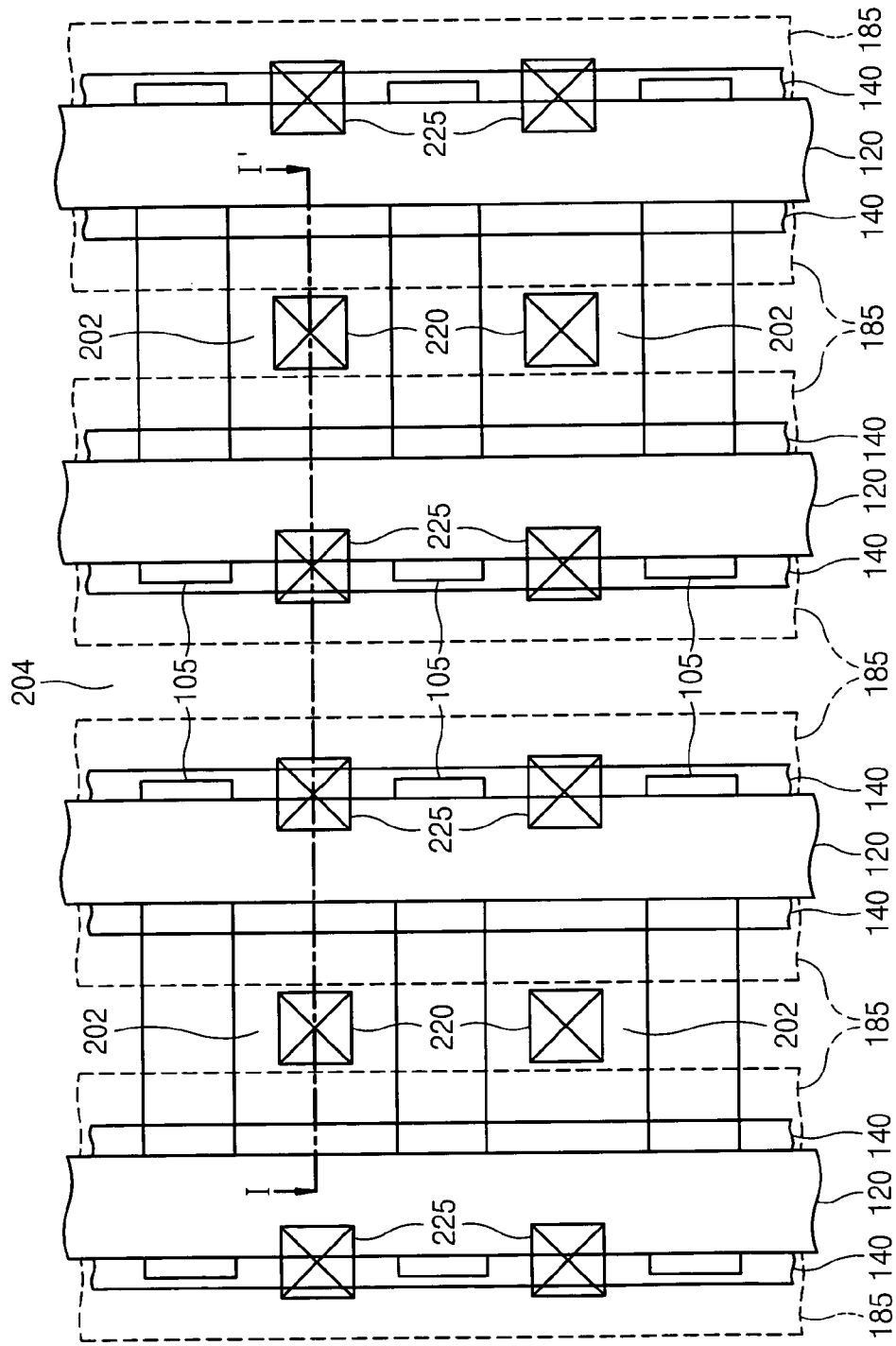

NONVOLATILE MEMORY DEVICE AND METHOD OF FORMING SAME

This application claims the priority of Korean Patent Application No. 2003-04223, filed on Jan. 22, 2003 in the Korean Intellectual Property Office, the disclosure of which is incorporated herein in its entirety by reference.

BACKGROUND OF THE INVENTION

1. Field of the Invention

The present invention relates to a nonvolatile memory device and a method of forming a nonvolatile memory device.

2. Description of Related Art

As electrical devices become miniaturized and portable, the need for nonvolatile memory devices becomes even greater. In general, nonvolatile memory devices store information without having to supply electrical power. For example, a nonvolatile memory device such as a flash memory employs a floating gate to store information. The flash memory changes information stored in a cell transistor, for example, by performing program and erase operations. The program and erase operations generally require large voltage differences (greater than about 10 volts). Accordingly, the flash memory includes a plurality of pumping circuits to establish the necessary large voltage difference. As the number of pumping circuits needed on the nonvolatile memory device rise, the integrity of a semiconductor device product containing the nonvolatile memory device is reduced, and cost of the product increases. In addition, the flash memory has a technical disadvantage, in that the transistor employing the flash memory (and interconnections thereto) should be designed so as to avoid breakdown due to the large voltage difference.

As an alternative to flash memory devices, a silicon-oxide-nitride-oxide-silicon (SONOS) type nonvolatile memory device has recently been studied and proposed. Generally, the SONOS type nonvolatile memory device includes sequentially stacked layers, e.g., an oxide layer, a nitride layer, another oxide layer and a polysilicon layer that are sequentially stacked. The nitride layer is sandwiched between the oxide layers and used as an electric charge trapping medium. Information is stored in the charge trapping medium of the SONOS type nonvolatile memory device. In other words, the nitride layer performs a function similar to the function of a floating gate in the flash memory device.

In order to provide a highly integrated semiconductor device, a SONOS type nonvolatile memory may be included in a structure where two adjoining cells, such as memory transistor cells, share a common source line. In this case, the two cells may have different channel lengths. Asymmetrical channel lengths may occur in what is referred to as a 'split-gate' type FLASH memory, for example.

FIGS. 9 and 10 are perspective views illustrating a prior art method for fabricating a SONOS type nonvolatile memory device. Referring to FIGS. 9 and 10, a lower oxide layer 20 is formed on the semiconductor substrate 10, and a charge storage pattern 30 is formed on the lower oxide layer 20. The charge storage pattern 30 is formed of an insulating layer (such as a silicon nitride layer, for example) having a sufficient number of charge trap sites. Then, an upper oxide layer 40 is formed on the charge storage pattern 30 so as to conform to the charge storage pattern 30.

A gate conductive layer is formed over an entire surface of the semiconductor substrate 10 and the upper oxide layer 40. The gate conductive layer is then patterned to form gate patterns 50 crossing over the charge storage pattern 30. An ion implantation process is performed using the gate patterns 50 as a mask to form an impurity region 60 in the semiconductor substrate 10. The impurity regions 60 are used as a source and/or a drain of a memory cell transistor.

The gate patterns 50 are typically formed by a conventional photolithographic process so as to be misaligned to the charge storage pattern 30. As shown in FIG. 10, channel lengths l1 and l2 of the adjoining two cell transistors may be changed by the misalignment between the gate pattern 50 and the charge storage pattern 30 (i.e., l1≠l2).

The asymmetry due to the misalignment may cause what is known as 'periodical irregularities' to appear at interconnections between one or more cell transistors and the one source line. These periodical irregularities are commonly known as 'even-odd failures' and may adversely affect cell transistor performance.

SUMMARY OF THE INVENTION

An exemplary embodiments of the present invention is directed to a method of forming a silicon-oxide-nitride-oxide-silicon (SONOS) type nonvolatile memory device and a SONOS type memory device. In the method, a plurality of first gates may be formed on a semiconductor substrate. A plurality of charge storage spacers may be formed on the plurality of first gates so that a given charge storage spacer may be disposed on a sidewall of a given first gate. A plurality of second gates may be disposed on the plurality of first gates so that a given second gate is on a sidewall of a given first gate and covers a given charge storage spacer.

BRIEF DESCRIPTION OF THE DRAWINGS

Exemplary embodiments of the present invention will become more fully understood from the detailed description herein below and the accompanying drawings, wherein like elements are represented by like reference numerals, which are by way of illustration only and thus do not limit the exemplary embodiments of the present invention and wherein:

FIGS. 1A to 1H are top plan views illustrating a SONOS type nonvolatile memory device in accordance with the exemplary embodiments of the present invention.

DETAILED DESCRIPTION OF THE EXEMPLARY EMBODIMENTS

Figure 1D:
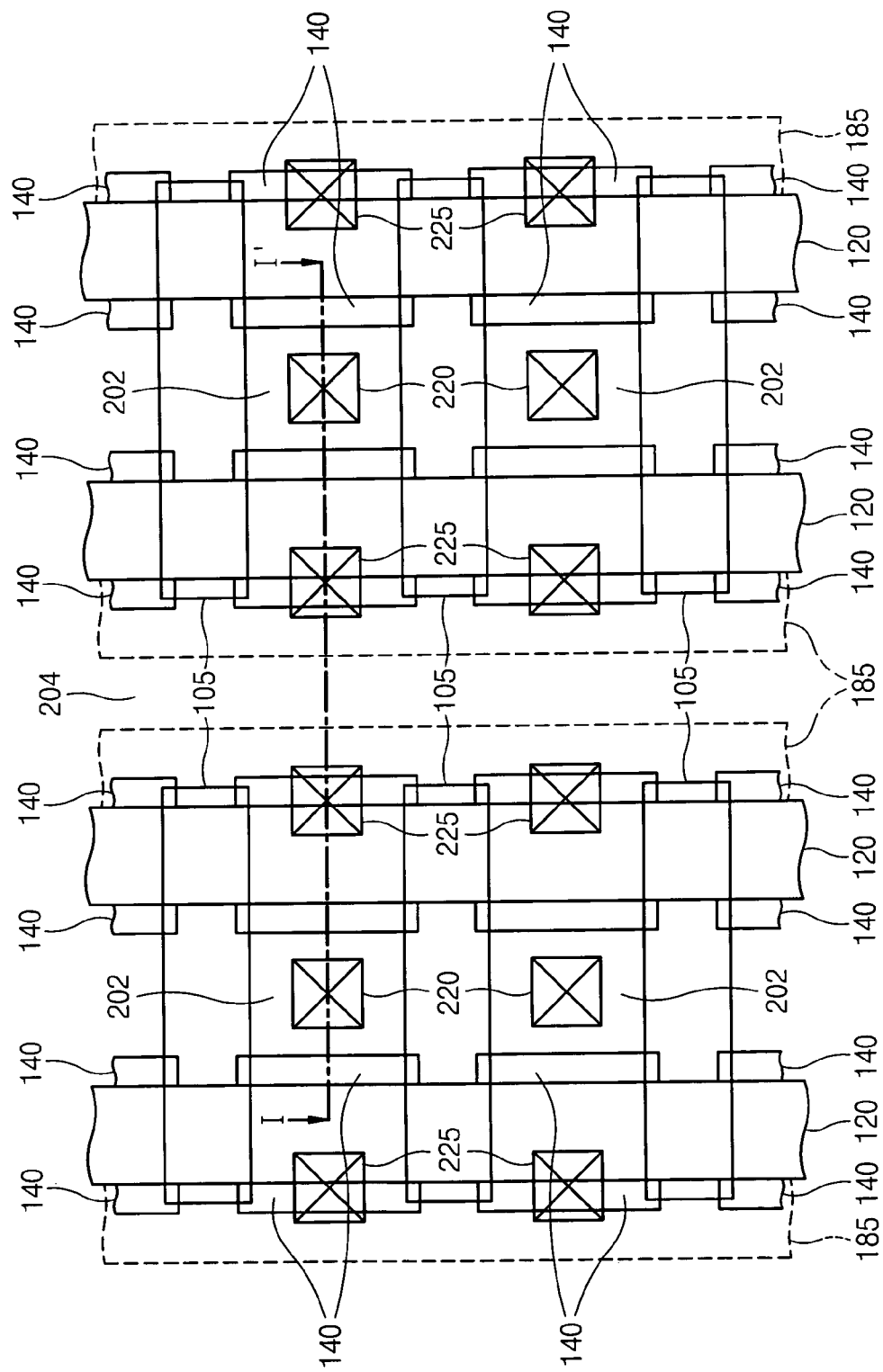

The present invention will be described more fully hereinafter with reference to the accompanying drawings, in which exemplary embodiments of the invention are shown. The present invention is not limited to the exemplary embodiments set forth herein, which are provided so that the disclosure will be thorough and complete, and will fully convey the scope of the invention to those skilled in the art. In the drawings, the thickness of layers and regions are exaggerated for clarity. It will also be understood that when a layer is referred to as being "on" another layer or semiconductor substrate, it can be directly on the other layer or semiconductor substrate, or intervening layers may also be present. Like numbers refer to like elements throughout.

FIGS. 1A to 1H are top plan views illustrating a SONOS type nonvolatile memory device, and FIGS. 2A to 2E are perspective views illustrating a SONOS type non-volatile memory device in accordance with the exemplary embodiments of the present invention. FIGS. 2A to 2E correspond to FIGS. 1A, 1C, 1D, 1E and 1F, respectively.

Referring to FIGS. 1A to 1H and 2A to 2E, the SONOS type nonvolatile memory device may include a plurality of device isolating layers 105 disposed so as to define active regions in a given region or area of a substrate 100. The device isolating layers 105 may be disposed along columns (i.e., x-axis) and rows (i.e., y-axis), i.e., in 2-dimensions. In this case, each device isolating layer 105 may be island-shaped so as to have a different length and width. For example, the device isolating layers 105 may be rectangular-shaped or elliptical-shaped active regions.

The SONOS type nonvolatile memory device may include a plurality of first gates 120 provided on the substrate. The first gates 120 may be arranged in parallel along columns or rows, for example. In an exemplary embodiment, several first gates 120 may be arranged so as to cross over device isolating layers 105. That is, a plurality of device isolating layers 105 are disposed in parallel along one direction, and a plurality of first gates 120 are arranged so as to cross over these device isolating layers 105, perpendicular to the device isolating layers 105.

Based on the above configuration, two different first gates 120 may be arranged at sides (i.e., one first gate on either side) of an arbitrary first gate 120. The arbitrary first gate may be referred to as a 'reference gate'. Thus may be illustrated in FIG. 1A, for example, where a first gate 120 labeled "Ref" at an upper portion of FIG. 1A may represent the reference gate, a first gate 120 is labeled "L" to the left of the first gate labeled Ref, and a first gate 120 is labeled "R" to the right of the first gate labeled Ref. The reference gate (Ref) and left gate (L) cross over the same device isolating layer 105. The reference gate (Ref) and right gate (R) cross over different device isolating layers 105, as shown in FIG. 1A, for example. The reference gate (Ref) and right gate (R) may be hereinafter referred to as a 'gate pair'. In other words, the gate pair represents adjoining first gates 120 that cross over different device isolating layers 105.

The active region between an adjoining gates of a gate pair (i.e., L and Ref being adjoining gates of one pair; Ref and R being adjoining gates of another gate pair in FIG. 1A) may be referred to as a first impurity region 202. The first impurity regions 202 may be used as a drain of the cell transistors. The first impurity regions 202 are divided by the device isolating layers 105. Bit line contact plugs 220 may be disposed on each of the first impurity regions 202. The bit line contact plugs 220 may be connected by a bit line (not shown). The bit line contact plugs 220 may be arranged along a direction that is perpendicular to the first gates 120, for example.

The active regions between the gate pair may be referred to as second impurity regions 204. The second impurity regions 204 may be used as a source region of cell transistors, for example. The first gates 120 of the gate pair cross over different device isolating layers 105 without being divided by the device isolating layers 105. Therefore, the second impurity region 204 may be used as a common source line connecting the source regions of a plurality of transistors.

The SONOS type nonvolatile memory device may include charge storage spacers 140. The charge storage spacers 140 may be provided on one sidewall of the first gate 120, so as to be disposed between two first gates 120 constituting the gate pair (i.e., adjacent to the second impurity region 204). Alternatively, as illustrated in FIGS. 1C, 1D, 1G, 1H, 2B and 2C, the charge storage spacers 140 may be disposed on another sidewall of the first gate 120 (i.e., adjacent to the first impurity region 202). However, in this configuration adjacent first impurity region 202, the charge storage spacers do not perform an information-storing function of a memory, but employed as a mask in an ion implantation process, for example.

The charge storage spacers 140 may be cut over the device isolating layer 105 to form a rectangular-shaped island, as illustrated in FIGS. 1B, 1D, 1H and 2C. Alternatively, instead of being cut over the device isolating layer 105, the charge storage spacers 140 may be arranged so as to extend in a continuous fashion along a sidewall of the first gate 120.

The SONOS type nonvolatile memory device may include second gates 185. Two second gates 185 on a top surface and sidewalls of the charge storage spacers 140 may be disposed between the gate pair. The second gates 185 may be formed at, or in the vicinity of, a region where the charge storage spacers 140 are arranged, such that a second gate 185 covers one charge storage spacer 140. Alternatively, a second gate 185 may be disposed at both sidewalls of a first gate 120, as illustrated in FIGS. 1E, 1G, 1H and 2D, for example.

Figure 1E:
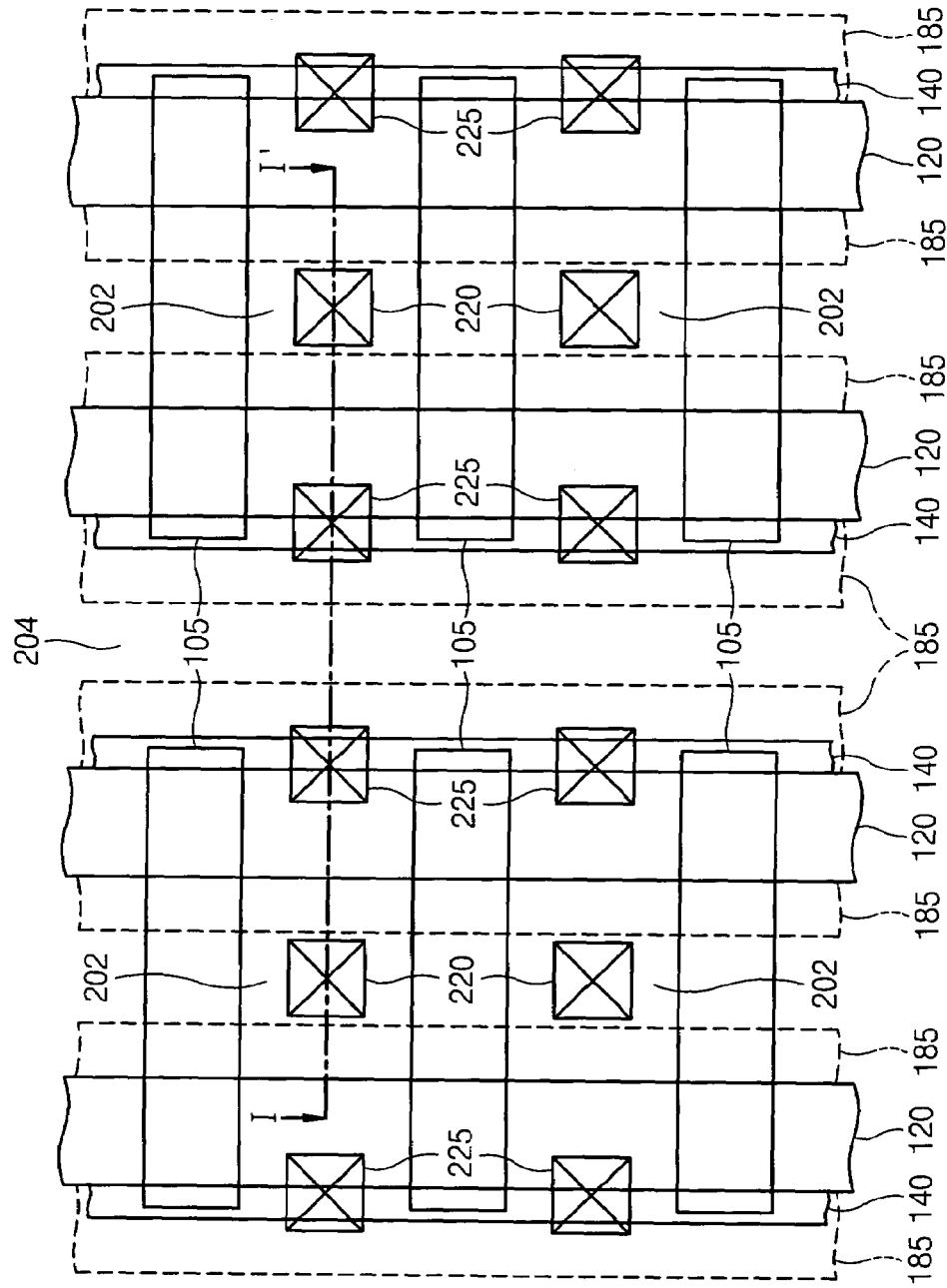
Figure 1F:
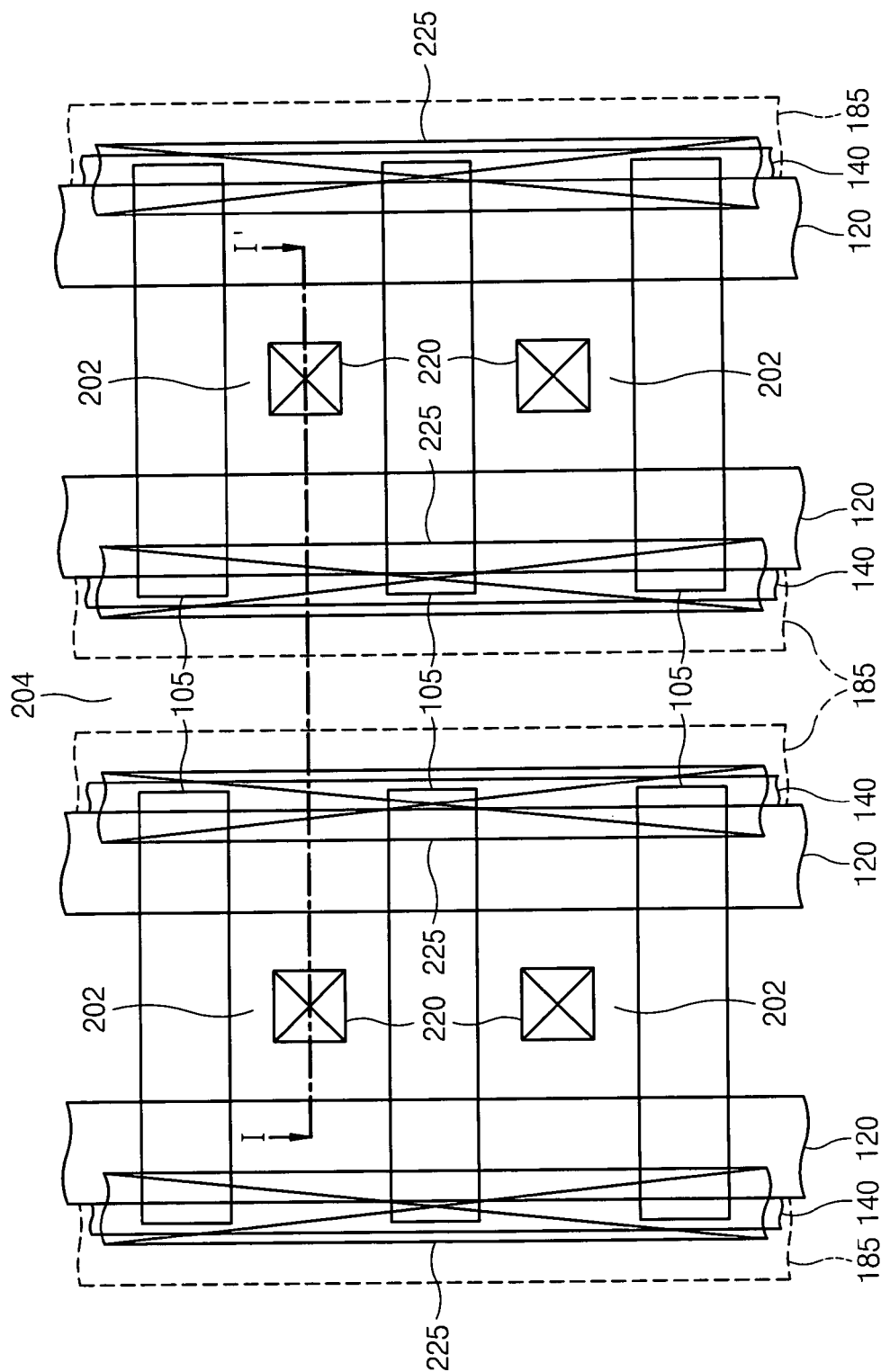
Figure 1H:
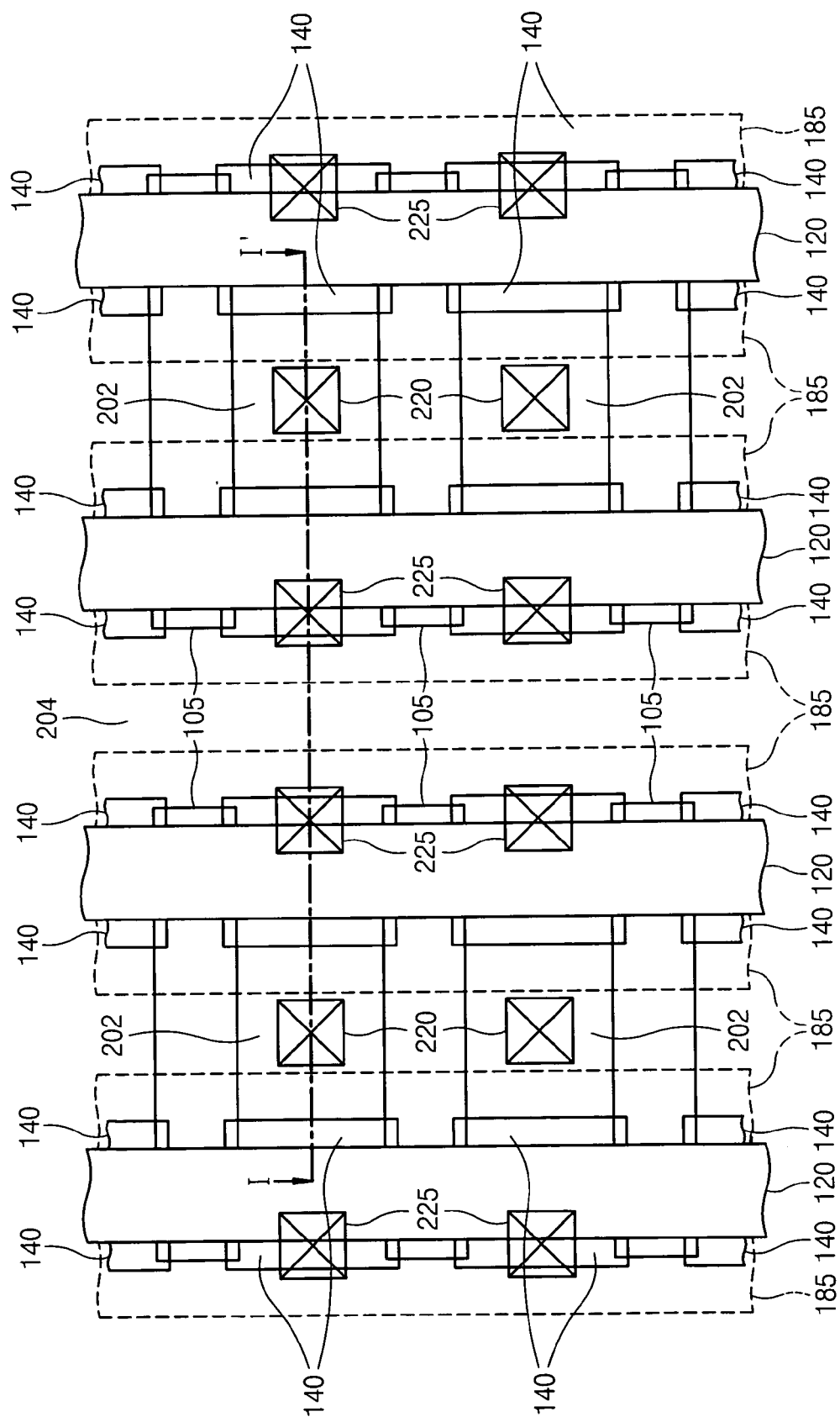
Figure 2A:
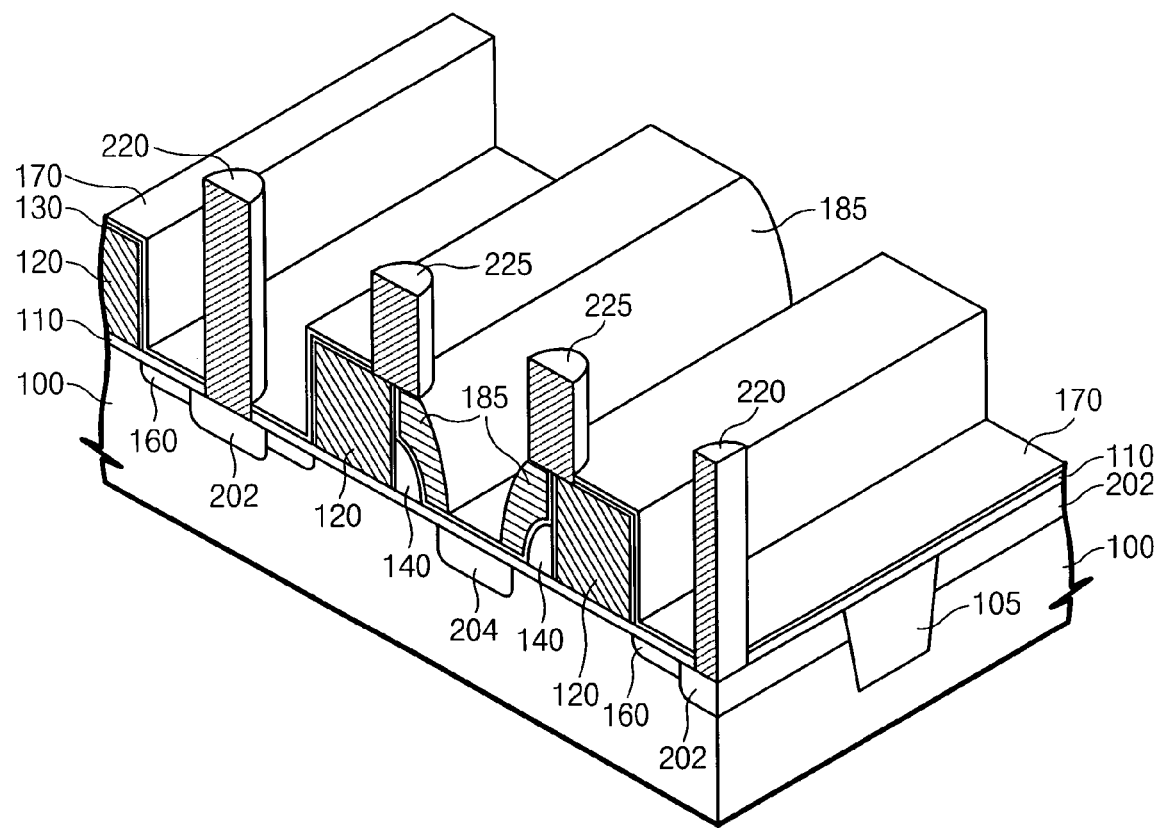
FIGS. 2A to 2E are perspective views illustrating a SONOS type non-volatile memory device in accordance with the exemplary embodiments of the present invention.
Figure 2B:
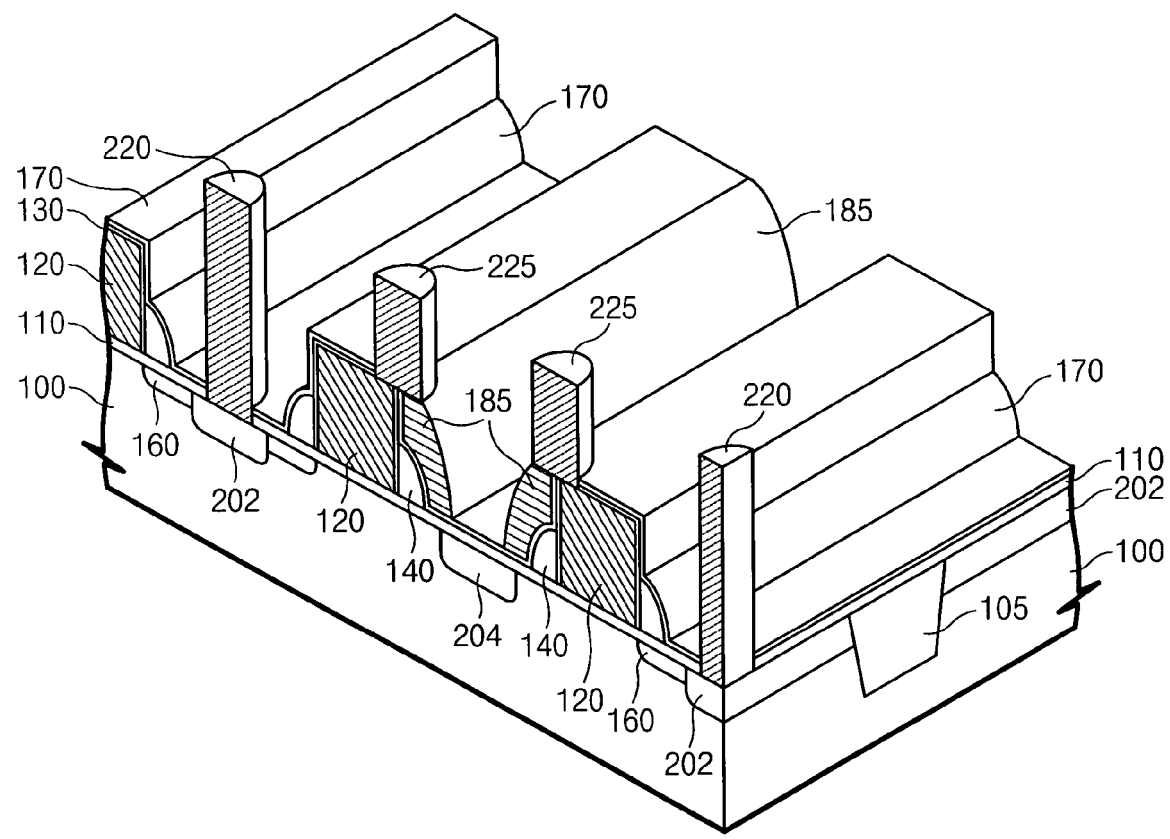
Figure 2C:
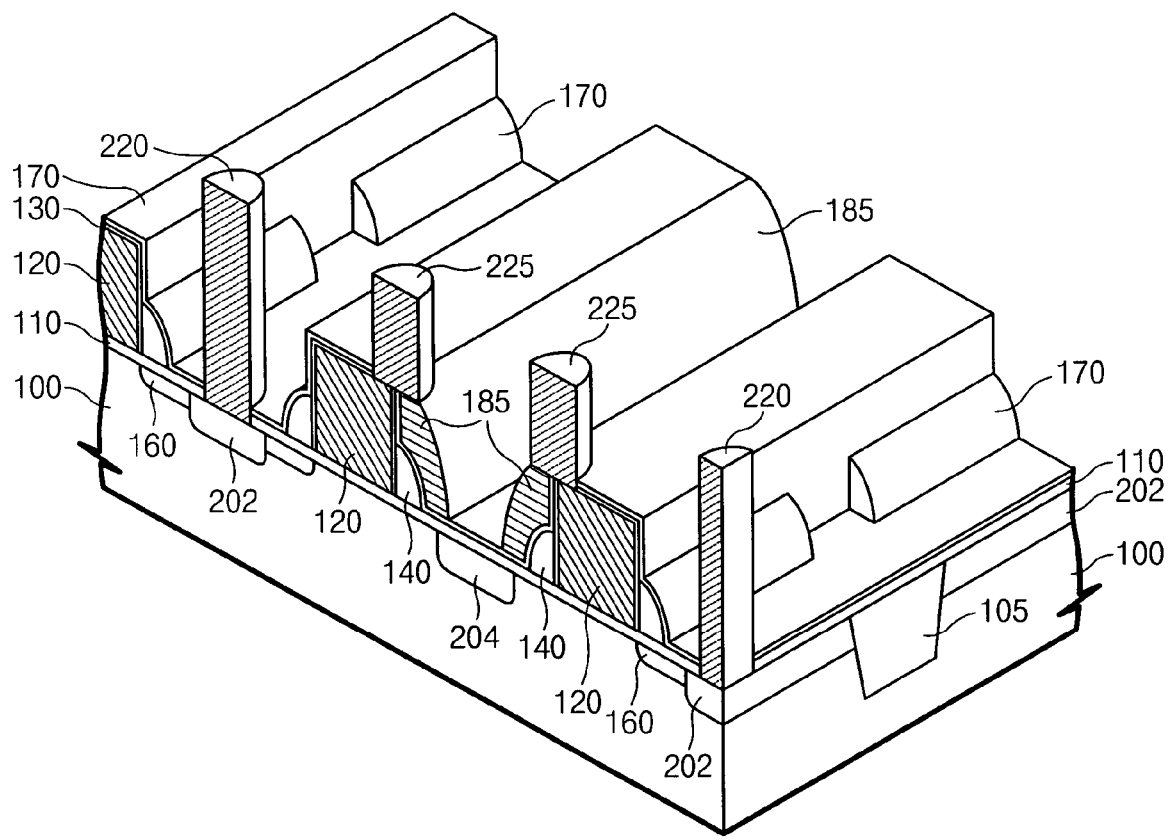
Figure 2D:
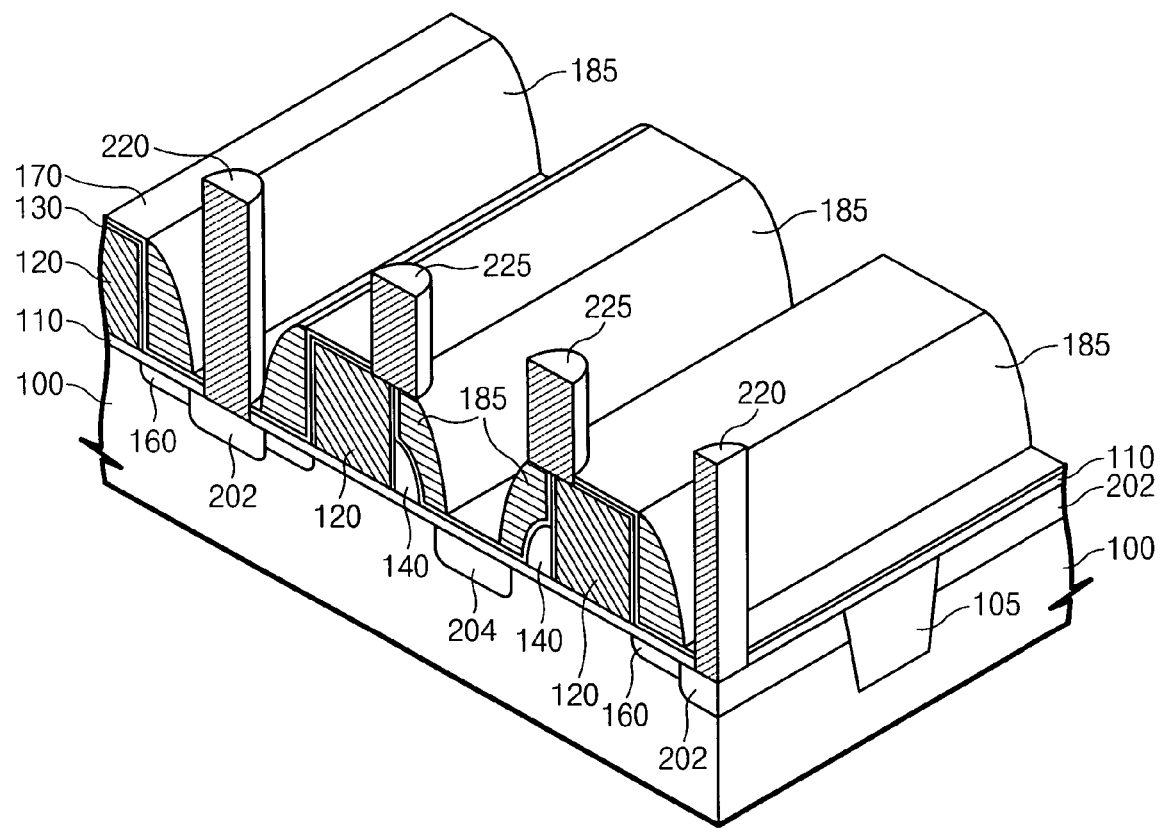
Figure 2E:
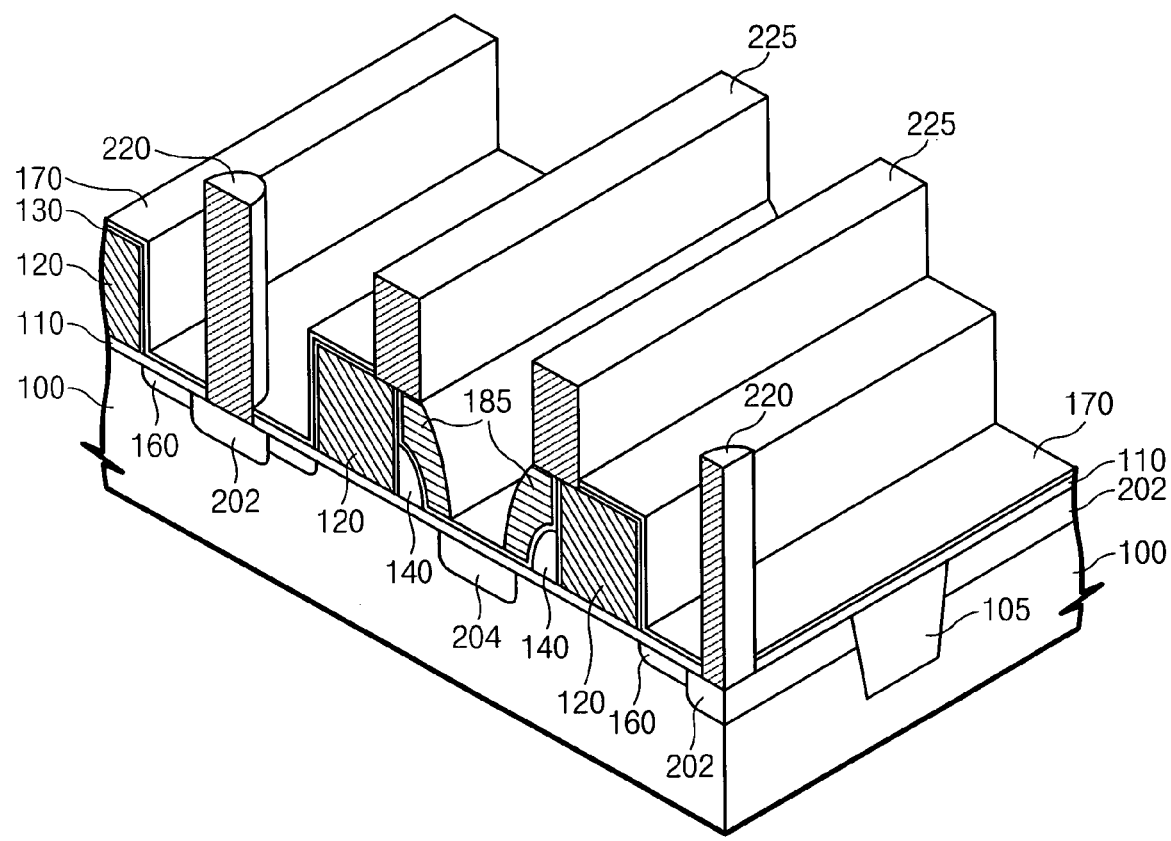

An interlayer insulating layer (not shown) may cover the semiconductor substrate, first gates 120 and second gates 185. A connector 225 may be disposed in the interlayer insulating layer to connect the second gates 185 and first gates 120. As illustrated in FIGS. 1A–1E, 1G, 1H, and 2A–2D, for example, the connector 225 may have a rod-shaped form, similar to the bit line contact plug 220. Alternately, as illustrated in FIGS. 1F and 2E, the connecter 225 may be continuously disposed along the first gate 120 without being cut. The non-cut connector 225 of FIGS. 1F and 2E may be employed in any of the other exemplary embodiments.

The SONOS type nonvolatile memory device may include a gate insulating layer 110 that is disposed on the semiconductor substrate 100. The first gate 120, second gate 185 and charge storage spacer 140 may be disposed on the gate insulating layer 110. A first insulating layer 130, such as a silicon oxide layer, for example, may be disposed between the first gate 120 and a second insulating layer 170.

The second insulating layer 170 may be disposed between the charge storage spacer 140 and second gate 185. Additionally, the second insulating layer 170 may be arranged so as to be between the first gate 120 and the second gate 185, as well as between the second gate 185 and the gate insulating layer 110. In accordance with the exemplary embodiments of the present invention, a non-volatile memory may operate (e.g., to perform operations or functions such as programming, erasing, reading, etc.), in accordance with conventional operation mechanisms such as hot carrier injection, Fowler-Nordheim tunneling, etc. Exemplary operating conditions in accordance with the exemplary embodiments of the present invention may be shown in Table 1, it being understood that the nonvolatile memory in accordance with the exemplary embodiments of the present invention may be operated under operating conditions that are different from, or a modification of, the operating conditions shown in Table 1.

TABLE 1

OPERATING CONDITIONS OF CELL TRANSISTOR

| | gate | source | drain | substrate |
|---|---|---|---|---|
| programming | Vcc | H/V | GND | GND |
| erasing | H/V | 0 | 0 | 0 |
| reading | Vcc | 0 | Vcc/2 | GND |

Referring to Table 1, during a programming operation, a voltage Vcc may be applied to a gate electrode of the nonvolatile memory in accordance with the exemplary embodiments of the present invention. Therefore, even when a high voltage H/V is applied to the gate electrode, dissipation current may be prevented from overflowing.

FIGS. 3 to 8 are cross-sectional views illustrating a method for forming a SONOS type nonvolatile memory device in accordance with the exemplary embodiments of the present invention. FIGS. 3–8 illustrate sequential steps of a fabricating process for forming a SONOS type memory device. Each of FIGS. 3–8 illustrate a cross-section as taken along a dotted line I–I' of FIG. 1A.

Figure 3:
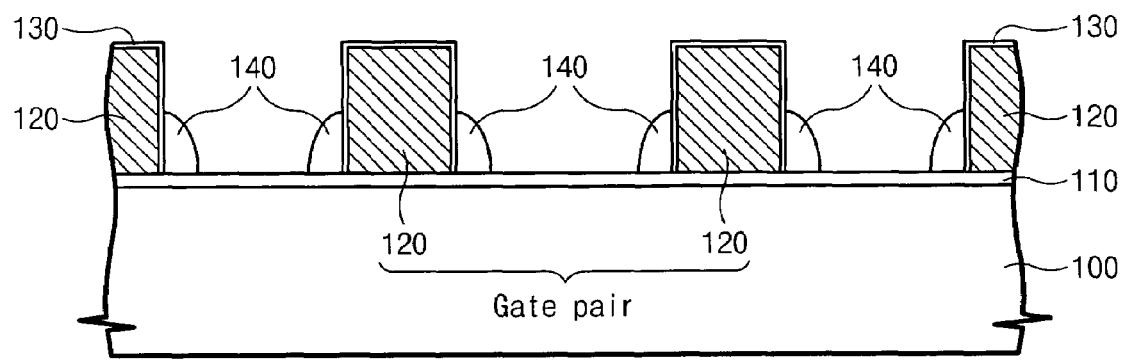
FIGS. 3 to 8 are perspective views illustrating a method for forming a SONOS type non-volatile memory in accordance with the exemplary embodiments of the present invention.

Referring to FIG. 3, and with reference to FIG. 1A, a plurality of device isolating layers 105 may be formed so as to define active regions in a given region or area of semiconductor substrate 100. A gate insulating layer 110 may then be formed on the active region, and a first gate conductive layer formed on an entire surface of the semiconductor substrate 100, including the gate insulating layer 110.

As discussed above, the device isolating layers 105 may be disposed along columns in two-dimensions (i.e., x-axis direction and y-axis direction). Thus, each device isolating layer 105 may be island-shaped (rectangular-shaped or elliptical—shaped active regions, for example) so as to have a different length and width. The device isolating layer 105 may be formed using a conventional Local Oxidation of Silicon (LOCOS) technology, for example. Alternatively, trench technology may be used for forming the device isolating layer 105. In addition, the gate insulating layer 110 may be formed of silicon oxide by thermally oxidizing the active region on semiconductor substrate 100. The first gate conductive layer may be formed of polysilicon, or polysilicon and silicon layers that are sequentially stacked, for example. An insulating layer used as an anti-reflecting layer or a hard mask layer ("mask") may be further disposed on the first gate conductive layer.

Then, the first gate conductive layer is patterned to form a plurality of first gates 120 crossing over the active region and device isolating layer 105. The first gates 120 may be disposed in parallel along columns or rows. In an exemplary embodiment, a plurality of device isolating layers 105 may be disposed in parallel along one direction, and two of the first gates 120 may be formed to cross over these parallel device isolating layers 105. In this case, two of the first gates 120 may be embodied as the aforementioned gate pair illustrated in FIG. 1A. In other words, the gate pair may represent the adjoining two first gates 120 (Ref and R) crossing over the different or separate device isolating layers 105 of FIG. 1A.

A first insulating layer 130 may be formed on an entire surface of a portion of the semiconductor substrate 100 that includes the first gates 120. For example, the first insulating layer 130 may be formed of silicon oxide by thermally oxidizing surfaces of the first gates 120, or may be formed by a chemical vapor deposition (CVD) process, for example.

Continuously, a charge storage layer (not shown for reasons of clarity) may be formed so as to conform to the surface of the semiconductor substrate 100 and first insulating layer 130. The charge storage layer is employed for storing information in a SONOS type nonvolatile memory device, for example. The charge storage layer may be formed of a material that has sufficient trap sites for storing information, such as silicon nitride or silicon oxynitride, for example, or another material that has sufficient trap sites for storing information. The charge storage layer may be anisotropically etched to form charge storage spacers 140. The charge storage spacers 140 may be disposed on sidewalls of the first gates 120. The charge storage spacers 140 may be formed so that top surfaces of the charge storage spacers 140 are lower than the first gates 120, as shown in FIG. 3. In order to accomplish this, the anisotropic etching process is performed to expose the first insulating layer 130 on the first gate 120, and to expose the gate insulating layer 110 on the active region between the first gates 120. The etching process may employ an etch recipe having etch selectivity with respect to the silicon oxide layer, or with respect to a silicon layer.

Figure 4:
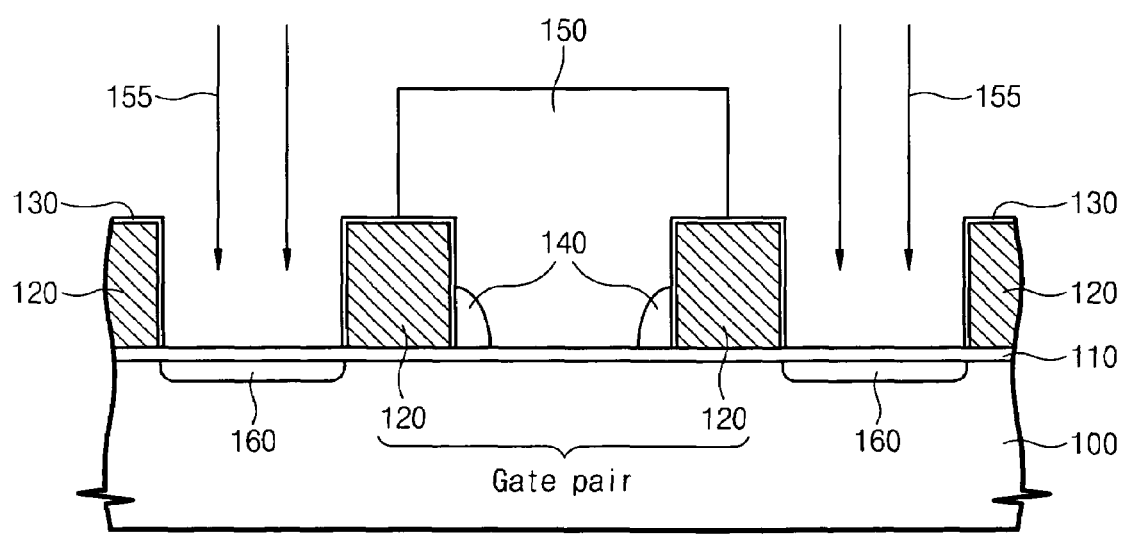

Referring now to FIG. 4, with reference to FIG. 1A, a mask pattern 150 is formed on a given region of the semiconductor substrate 100 that includes the charge storage spacers 140. The mask pattern 150 may be a photoresist formed by a conventional photolithographic process, for example. The mask pattern 150 is formed to cover the charge storage spacers 140 between the gate pair and the active regions between the charge storage spacers 140. In this case, both sidewalls of the mask pattern 150 are formed in the middle of a top surface of each first gate 120, as shown in FIG. 4. Thus, any charge storage spacers 140 on the external sidewalls of the gate pair (see FIG. 3, for example) are exposed.

Using the mask pattern 150 as an etch mask, the exposed charge storage spacers 140 may be removed via a suitable etching process; FIG. 4 illustrates a state of the fabrication process in which the charge storage spacers 140 on the external sidewalls of the pair of first gates 120 have already been removed. In this case, the internal charge storage spacers 140 covered with the mask pattern 150 are not etched, as shown in FIG. 4. The etching process may be performed using an etch recipe having etch selectivity with respect to the gate insulating layer 110, the first insulating layer 130 and the mask pattern 150. The etching process may be an isotropic etching or wet etching process for example, e.g., a wet etching process using an etchant with phosphoric acid, for example.

Using the mask pattern 150 and the first gates 120 as an etch mask, a first ion implantation process 155 may be performed to form a first impurity region 160. The first impurity region 160 may be used as a drain of a cell transistor, and is formed in the active region between the gate pair. As illustrated in FIGS. 1A to 1H, the first impurity region 160 is divided by the device isolating layers 105.

The charge storage spacers 140 covered with the mask pattern 150 between the pair of gates are thus not removed (See FIGS. 1C, 1D, 1G and 1H). In this case, the first impurity region 160 is spaced apart from the charge storage spacers 140 by first gates 120. However, the first impurity region 160 may be expanded during subsequent processes so as to extend under the charge storage spacers 140. This may be accomplished using thermal diffusion, for example.

Figure 5:
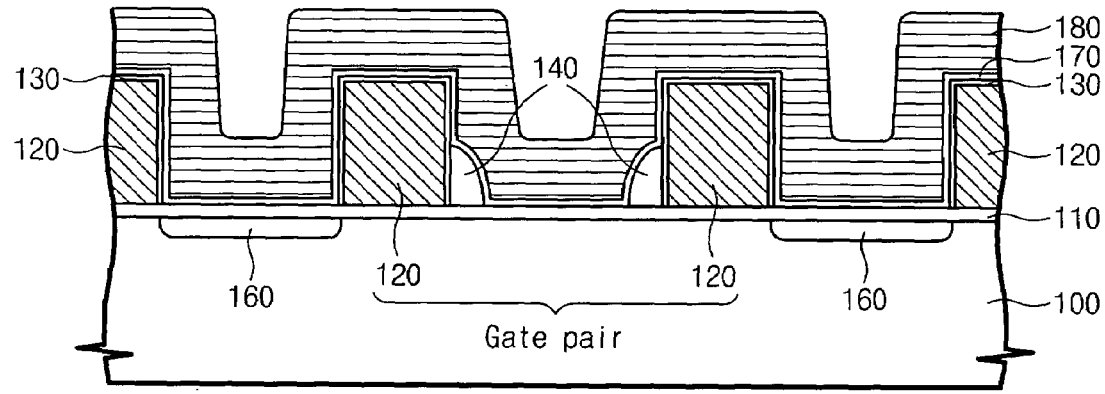

Referring now to FIG. 5, and with reference to FIG. 1A, the mask pattern 150 may be removed to expose the charge storage spacers 140. A second insulating layer 170 and a second gate conductive layer 180 may then be sequentially formed on the entire surface of the semiconductor substrate 100, once the mask pattern 150 has been removed.

The second insulating layer 170 may be formed of silicon oxide by a CVD process, for example, so as to have good step coverage. Operation of the nonvolatile memory could be substantially affected by the thickness of the second insulating layer 170. Thus, the second insulating layer 170 may be formed by an atomic layer deposition (ALD) process to more precisely control deposition thickness.

Figure 6:
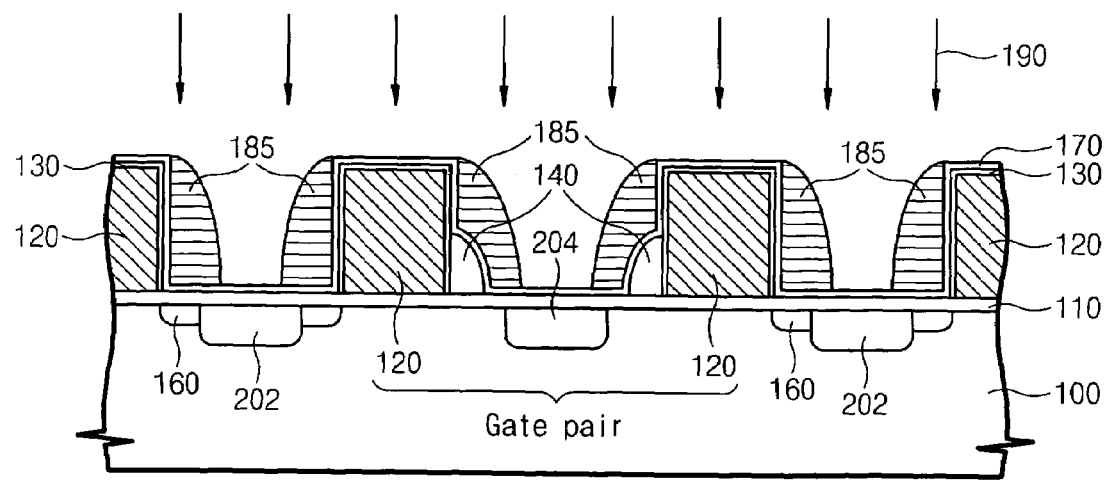

The second gate conductive layer 180 may be formed of polysilicon so as to have good step coverage. For example, the second gate conductive layer 180 may be formed by a CVD process that includes a step of thermally dissolving the polysilicon with silane gas ($SiH_4$) or disilane gas ($Si_2H_6$). In addition, the step of forming the second gate conductive layer 180 may further include performing an impurity doping step, either by ion-implantation or in-situ, in order to ensure that the second gate conductive layer 180 has good conductivity characteristics. Referring now to FIG. 6, and with reference to FIG. 1A, the second gate conductive layer 180 may be anisotropically etched until the second insulating layer 170 is exposed to thereby form the second gates 185. The second gates 185 may be disposed on both sidewalls of the first gates 120, as shown in FIG. 6 for example.

Figure 8:
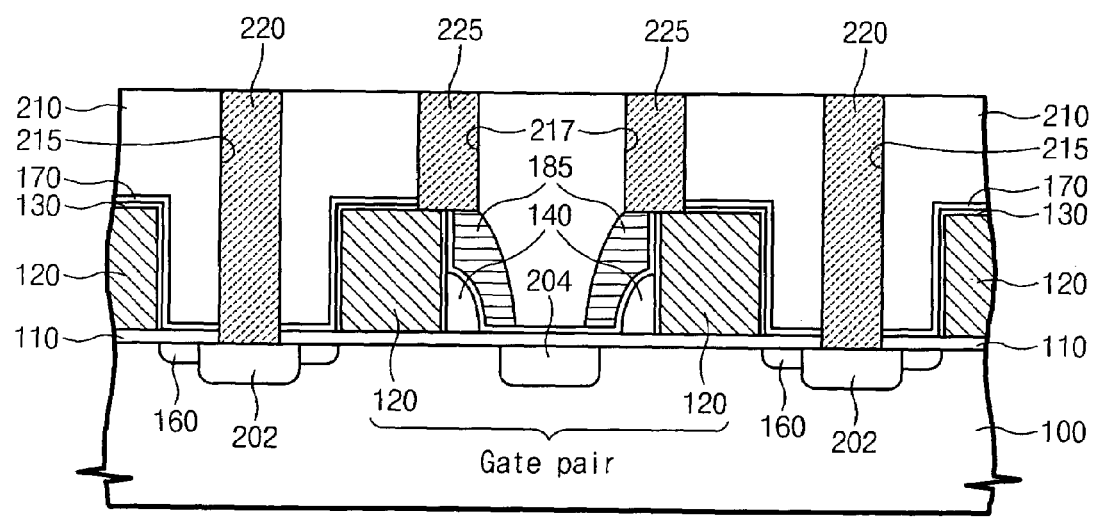
Figure 9:
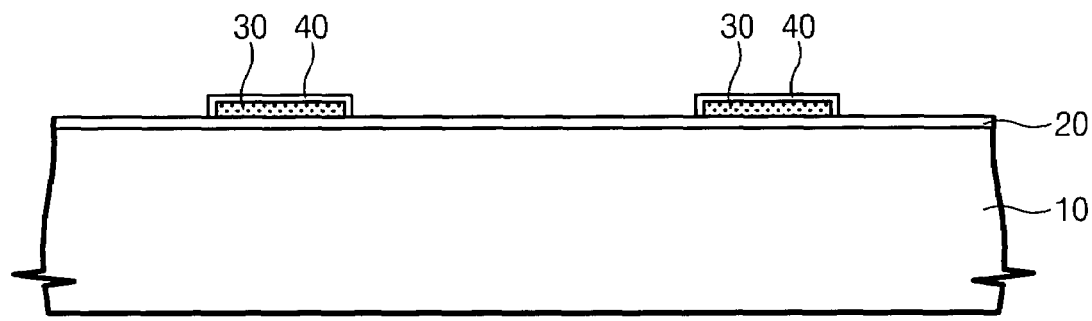
FIGS. 9 and 10 are perspective views illustrating a prior art method for fabricating a SONOS type nonvolatile memory device.
Figure 10:
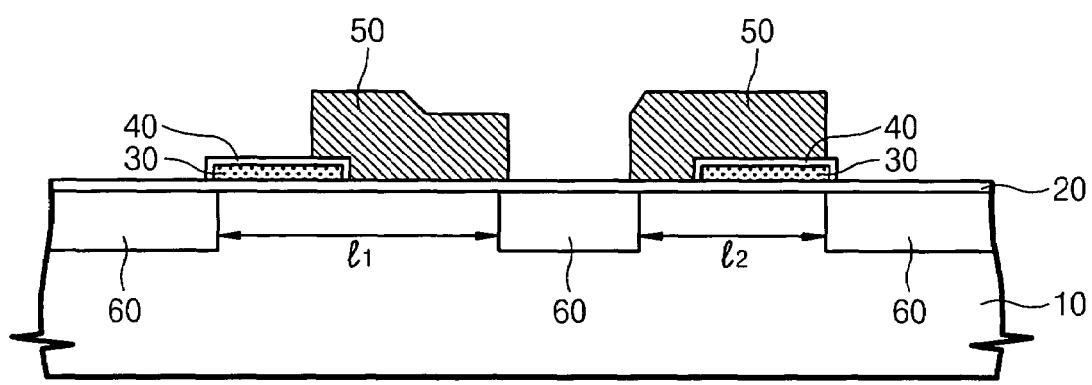

Referring now to FIG. 8, the second gates 185 disposed in facing relation on internal sidewalls of the gate pair may serve as another gate electrode of the SONOS type nonvolatile memory. As shown in FIG. 8, the second gate 185 may be connected to the adjoining first gates 120. Meanwhile, and as shown in FIG. 6, the portions of the second gates 185 that are disposed on external sidewalls of the gate pair do not serve as a gate electrode, but may be used as an ion implantation mask in a subsequent process, for example.

A second ion implantation process 190 may be performed using the second gates 185 and first gates 120 as a mask. Thus, the second impurity region 204 may be formed in the active region between the first gates 120 composing the gate pair. The second impurity region 204 may be used as a source of a cell transistor. Additionally, a high-concentration drain region 202, which may be used as a drain of the cell transistor, may also be formed by the second ion implantation process 190 in the first impurity region 160, i.e., the active region between the gate pair.

In order to improve efficiency of a programming operation, the impurity concentration in the second impurity region 204 should be higher than the impurity concentration in the high-concentration drain region 202. Therefore, after forming another mask pattern to screen the first impurity region 160, an additional ion implantation process may be performed to inject impurities into the second impurity region 204.

Referring to FIG. 4 and FIG. 6, and according to an exemplary embodiment where the charge storage spacer 140 on external sidewalls of the first gates 120 have been removed, concentrations of the first ion implantation process 155 and second ion implantation process 190 may be different. Accordingly, the concentrations of the high-concentration drain region 202 and the second impurity region 204 may have different concentrations.

Figure 7:
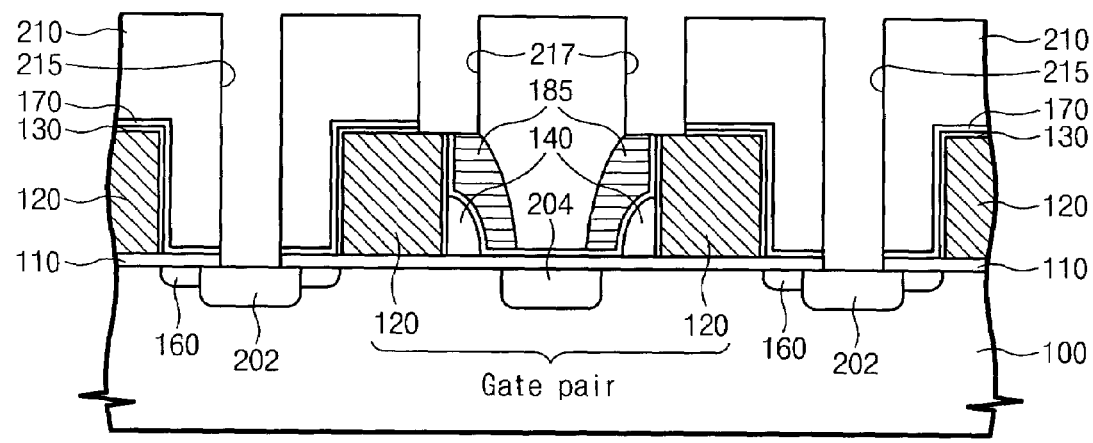

Referring now to FIG. 7, an interlayer insulating layer 210 may be formed on an entire surface of the semiconductor substrate 100, including the second impurity region 204. The interlayer insulating layer 210 may be patterned to form a contact hole 215 exposing the high-concentration drain region 202. A contact hole 215 may also be formed to expose the second impurity region 204 at a given region or area (not shown).

The interlayer insulating layer 210 may be composed of silicon oxide, silicon nitride or silicon oxynitride, for example. In addition, the interlayer insulating layer 210 may be formed by a CVD process, by a spin coating process, or by a physical vapor deposition (PVD) process, for example.

To form the interlayer insulating layer 210, as illustrated in FIG. 7, selected second gates 185 may be selectively removed. An etch mask exposes those second gates 185 disposed on first impurity region 160 for the selective removal of certain second gates 185. Thus, the mask pattern 150 used for forming the first impurity region 160 may be re-formed and used as an etching mask for the selective removal of certain second gates 185. The selective removal may be performed using an etch recipe having an etch selectivity with respect to the interlayer insulating layer 200 such as a silicon oxide layer. In addition, the selective removal may be performed by an isotropic etching process such as wet etching, for example. A resultant structure, where the second gates 185 have been selectively removed, has a plan structure as illustrated in FIGS. 1A, 1B, 1C, 1D and 1F. Alternatively, as illustrated in FIGS. 1E, 1G and 1H, an interlayer insulating layer 210 may be formed without removing the second gates 185.

In forming the contact hole 215, a connection opening 217 may be formed to expose the first gate 120 and second gate 185 adjacent to the first gate 120, as shown in FIG. 7, for example. The connection opening 217 may be a hole type opening (such as the contact hole 215) or a groove type opening that is not cut in the middle, as illustrated in FIG. 1F, for example.

Referring now to FIG. 8 and with occasional reference to FIG. 1A, a plug conductive layer may be formed on an entire surface of the semiconductor substrate 100 to fill the contact hole 215 and connection opening 217. The plug conductive layer may be etched to expose a top surface of the interlayer insulating layer 210, thereby forming a contact plug 220 that fills contact holes 215, and a connector 225 that fills the connection openings 217, respectively.

The plug conductive layer may be composed of a material selected from a group consisting of polysilicon, aluminum, tungsten, titanium, titanium nitride, tantalum and tantalum nitride, for example. The connector 225 electrically connects the first gate 120 and the adjoining second gate 185. Meanwhile, the etching of the plug conductive layer may be performed using a chemical mechanical polishing (CMP) process. In addition, the plug conductive layer may be over etched so as to be lower than a top surface of the interlayer insulating layer 210. Thus, the top of the contact plug 220 and the top of the connector 225 may be lower than a top surface of the interlayer insulating layer 210. Afterwards, another interlayer insulating layer may be formed on an entire surface of the resultant structures to form a bit line to connect the contact plugs 220.

According to the exemplary embodiments of the present invention, a gate electrode of a nonvolatile memory device of a cell transistor may be formed by a process used for forming charge storage spacers that store information in the nonvolatile memory device. The gate electrode may be configured so as to be self-aligned to the charge storage spacers, potentially preventing even-odd failure. In addition, a photolithographic process is not required in order to form the second gate electrode, so that production costs can be reduced. Accordingly, a stable SONOS type nonvolatile memory device may be fabricated at low cost. In addition, a voltage Vcc may be applied to a gate electrode during programming in an effort to prevent current from overflowing. Thus, a SONOS type nonvolatile memory device may be fabricated so as to have low or substantially low power consumption.

The exemplary embodiments of the present invention being thus described, it will be obvious that the same may be varied in many ways. Such variations are not to be regarded as departure from the spirit and scope of the exemplary embodiments of the present invention, and all such modifications as would be obvious to one skilled in the art are intended to be included within the scope of the following claims.

What is claimed is:

1. A method of forming a silicon-oxide-nitride-oxide-silicon (SONOS) type non-volatile memory device, comprising:
    forming a plurality of first gates on a semiconductor substrate;
    forming a plurality of charge storage spacers on a lower sidewall of the plurality of first gates so that an upper sidewall of a given first gate is exposed by a given charge storage spacer; and
    forming a plurality of second gates to be self-aligned to the plurality of charge storage spacers at the side of the plurality of first gates so that a given charge second gate covers the exposed upper sidewall of the given first gate and the given storage spacer.

2. The method of claim 1, further comprising, prior to forming the plurality of first gates:
    forming a device isolating layer defining an active region in a given region of the semiconductor substrate prior to forming the plurality of first gates; and
    forming a gate insulating layer on the active region prior to forming the plurality of first gates.

3. The method of claim 2, wherein
    forming the device isolating layer includes forming the device isolating layer in two dimensions along columns and rows, and
    forming the plurality of first gates includes forming at least two first gates in parallel on the device isolating layers and disposed along one direction.

4. The method of claim 2, wherein forming the gate insulating layer includes forming the gate insulating layer by thermal oxidation.

5. The method of claim 1, further comprising:
    forming a first insulating layer on sidewalls of the given first gate prior to forming the plurality of charge storage spacers.

6. The method of claim 1, wherein forming the plurality of charge storage spacers includes:
    forming a charge storage layer on the semiconductor substrate and plurality of first gates; and
    anisotropically etching the charge storage layer to form the plurality of charge storage spacers, wherein the given charge storage spacer has a top surface that is lower in relation to a top surface of the given first gate.

7. The method of claim 6, wherein anisotropically etching uses an etch recipe that has an etch selectivity with respect to silicon oxide and silicon.

8. The method of claim 2, further comprising, prior to forming the plurality of second gates:
    forming a mask pattern covering an adjoining two first gates and a region between the adjoining first gates;
    forming a first impurity region in an active region between the mask patterns with a first ion implantation process using the mask pattern as a mask;
    removing any charge storage spacers that are disposed on the first impurity region; and
    removing the mask pattern, wherein the active region is confined by the device isolating layers.

9. The method of claim 8, wherein removing the charge storage spacers includes using an etch recipe that has etch selectivity with respect to silicon oxide and silicon.

10. The method of claim 8, further comprising:
    forming a mask pattern screening the first impurity region;
    forming a second impurity region in the active region with a second ion implantation process using the mask pattern as an ion implantation mask;
    removing the mask pattern; and
    removing any second gates disposed on the first impurity region.

11. The method of claim 1, further comprising:
    forming a second insulating layer to cover the semiconductor substrate and plurality of charge storage spacers, prior to forming the plurality of second gates.

12. The method of claim 1, wherein forming the plurality of second gates include:
    forming a second gate conductive layer on he semiconductor substrate and plurality of charge storage spacers; and
    anisotropically etching the second gate conductive layer with an etch recipe that has an etch selectivity with respect to silicon oxide and silicon.

13. The method of claim 1, further comprising:
    forming a source region with an ion implantation process that uses a second gate and a first gate as a mask.

14. The method of claim 1, further comprising:
    forming an interlayer insulating layer on the semiconductor substrate and plurality of second gates;
    patterning the interlayer insulating layer to form an opening that exposes top surfaces of the first gates and second gates;
    forming a conductive layer filling the opening; and
    patterning the conductive layer.

* * * * *